(12) United States Patent
Kim

(10) Patent No.: US 10,719,094 B2
(45) Date of Patent: Jul. 21, 2020

(54) INTERNAL VOLTAGE GENERATION CIRCUITS

(71) Applicant: SK hynix Inc., Icheon-si, Gyeonggi-do (KR)

(72) Inventor: Se Hwan Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/529,427

(22) Filed: Aug. 1, 2019

(65) Prior Publication Data

US 2020/0042027 A1 Feb. 6, 2020

Related U.S. Application Data

(63) Continuation-in-part of application No. 16/206,411, filed on Nov. 30, 2018, now Pat. No. 10,416,693.

(30) Foreign Application Priority Data

Aug. 6, 2018 (KR) .................. 10-2018-0091093

(51) Int. Cl.
| | | |
|---|---|---|
| *G05F 1/10* | (2006.01) | |
| *G11C 5/14* | (2006.01) | |
| *G05F 1/46* | (2006.01) | |
| *H03K 17/687* | (2006.01) | |
| *G05F 1/575* | (2006.01) | |

(52) U.S. Cl.
CPC .............. *G05F 1/465* (2013.01); *G05F 1/575* (2013.01); *G11C 5/147* (2013.01); *H03K 17/6872* (2013.01)

(58) Field of Classification Search
CPC . G05F 1/10; G05F 1/465; G11C 5/147; G06F 1/04; H03K 3/023; H03K 3/027; H03K 3/353
See application file for complete search history.

(56) References Cited

U.S. PATENT DOCUMENTS

| 8,509,024 B2 | 8/2013 | Goto et al. | |
|---|---|---|---|
| 8,922,273 B2* | 12/2014 | Na | G05F 1/465 |
| | | | 323/313 |
| 9,712,057 B1 | 7/2017 | Chen et al. | |
| 2012/0062189 A1 | 3/2012 | Wang et al. | |

FOREIGN PATENT DOCUMENTS

KR 1020180015318 A 2/2018

* cited by examiner

*Primary Examiner* — An T Luu
(74) *Attorney, Agent, or Firm* — William Park & Associates Ltd.

(57) ABSTRACT

An internal voltage generation circuit includes a counting operation control signal generation circuit and a drive control signal generation circuit. The counting operation control signal generation circuit compares a test internal voltage with a test reference voltage to generate a counting operation control signal in a test mode. The drive control signal generation circuit generates a drive adjustment signal whose logic level combination is adjusted according to the counting operation control signal in the test mode. In addition, the drive control signal generation circuit compares the test internal voltage with the test reference voltage in the test mode to generate a drive control signal for driving the test internal voltage.

14 Claims, 16 Drawing Sheets

FIG.13

| DTRIMP<1> | DTRIMP<2> | DCNTP |
|---|---|---|
| L | L | PL1 |
| H | L | PL2 |
| L | H | PL3 |
| H | H | PL4 |

FIG.15

| DTRIMN<1> | DTRIMN<2> | DCNTN |
|---|---|---|
| H | H | NL4 |
| L | H | NL3 |
| H | L | NL2 |
| L | L | NL1 | ns
INTERNAL VOLTAGE GENERATION CIRCUITS

CROSS-REFERENCE TO RELATED APPLICATIONS

The present application is a continuation application of U.S. patent application Ser. No. 16/206,411, filed on Nov. 30, 2018, and claims priority under 35 U.S.C 119(a) to Korean Application No. 10-2018-0091093, filed on Aug. 6, 2018, which is incorporated herein by reference in its entirety.

BACKGROUND

1. Technical Field

Embodiments of the present disclosure relate to semiconductor integrated circuits and, more particularly, to internal voltage generation circuits.

2. Related Art

In general, semiconductor devices receive a power supply voltage VDD and a ground voltage VSS from an external system to generate internal voltages used in operating the internal circuits constituting the semiconductor devices. The internal voltages used in the operations of the internal circuits of the semiconductor devices may include a core voltage supplied to a memory core region, a high voltage used to drive or overdrive word lines, a back-bias voltage applied to a bulk region (or a substrate) of NMOS transistors in the memory core region, and a bit line pre-charge voltage for pre-charging bit lines.

SUMMARY

According to an embodiment, an internal voltage generation circuit includes a counting operation control signal generation circuit and a drive control signal generation circuit. The counting operation control signal generation circuit compares a test internal voltage with a test reference voltage to generate a counting operation control signal in a test mode. The drive control signal generation circuit generates a drive adjustment signal whose logic level combination is adjusted according to the counting operation control signal in the test mode. In addition, the drive control signal generation circuit compares the test internal voltage with the test reference voltage in the test mode to generate a drive control signal for driving the test internal voltage. A level of the drive control signal is adjusted according to a logic level combination of the drive adjustment signal.

According to another embodiment, an internal voltage generation circuit includes a counting operation control signal generation circuit and an internal voltage drive adjustment circuit. The counting operation control signal generation circuit compares a test internal voltage with a test reference voltage to generate a pull-up counting operation control signal and a pull-down counting operation control signal in a test mode. The internal voltage drive adjustment circuit adjusts a level of a pull-up drive control signal for pulling up the test internal voltage in response to the pull-up counting operation control signal. In addition, the internal voltage drive adjustment circuit adjusts a level of a pull-down drive control signal for pulling down the test internal voltage in response to the pull-down counting operation control signal.

BRIEF DESCRIPTION OF THE DRAWINGS

FIG. 13 shows a table illustrating various levels of a pull-up drive control signal generated according to logic level combinations of a pull-up drive adjustment signal in the pull-up comparison drive adjustment circuit of FIG. 7.

FIG. 15 shows a table illustrating various levels of a pull-down drive control signal generated according to logic level combinations of a pull-down drive adjustment signal in the pull-down comparison drive adjustment circuit of FIG. 11.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
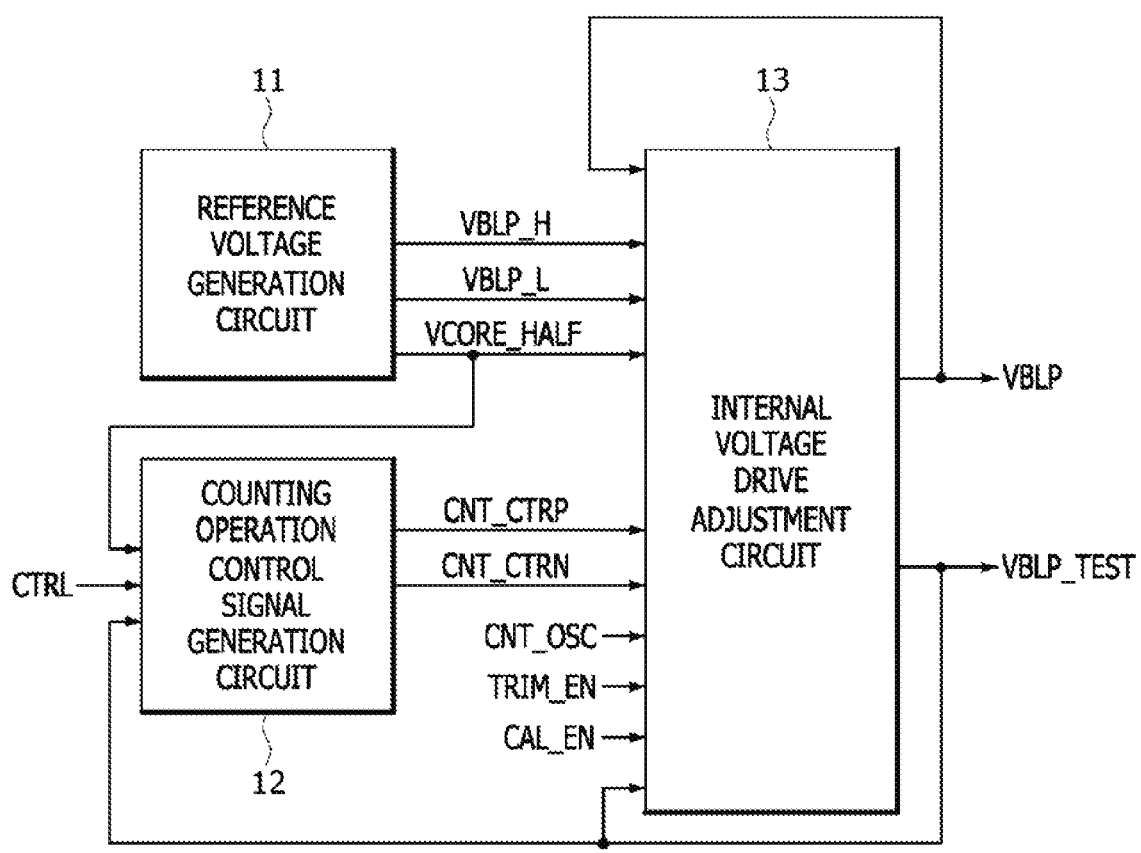
FIG. 1 shows a block diagram illustrating a configuration of an internal voltage generation circuit, according to an embodiment of the present disclosure.

As illustrated in FIG. 1, an internal voltage generation circuit 1 according to an embodiment may include a reference voltage generation circuit 11, a counting operation control signal generation circuit 12, and an internal voltage drive adjustment circuit 13.

The reference voltage generation circuit 11 may generate a lower limit reference voltage VBLP_L, an upper limit reference voltage VBLP_H, and a test reference voltage VCORE_HALF. The reference voltage generation circuit 11 may divide a core voltage (VCORE of FIG. 2) to generate the lower limit reference voltage VBLP_L, the upper limit reference voltage VBLP_H, and the test reference voltage VCORE_HALF. An operation and a configuration of the reference voltage generation circuit 11 is described more fully below with reference to FIG. 2.

The counting operation control signal generation circuit 12 may generate a pull-up counting operation control signal CNT_CTRP and a pull-down counting operation control signal CNT_CTRN from the test reference voltage VCORE_HALF and a test internal voltage VBLP_TEST in response to a control signal CTRL. A voltage level (also referred to herein simply as a level) of the control signal CTRL may change from a first logic level to a second logic level at a point in time when a time period necessary to drive the test internal voltage VBLP_TEST elapses from a point in time when a test mode for adjusting a level of the test internal voltage VBLP_TEST is activated. While the control signal CTRL has the first logic level, the counting operation control signal generation circuit 12 may drive the pull-up counting operation control signal CNT_CTRP to have the same logic level as the test reference voltage VCORE_HALF and may drive the pull-down counting operation control signal CNT_CTRN to have an inverted logic level of the test reference voltage VCORE_HALF. The counting operation control signal generation circuit 12 may generate the pull-up counting operation control signal CNT_CTRP and the pull-down counting operation control signal CNT_CTRN whose logic levels are determined according to a level of the test internal voltage VBLP_TEST while the control signal CTRL has the second logic level. The counting operation control signal generation circuit 12 may generate the pull-up counting operation control signal CNT_CTRP having the first logic level and the pull-down counting operation control signal CNT_CTRN having the second logic level if the test internal voltage VBLP_TEST is lower than the test reference voltage VCORE_HALF. The counting operation control signal generation circuit 12 may generate the pull-up counting operation control signal CNT_CTRP having the second logic level and the pull-down counting operation control signal CNT_CTRN having the first logic level if the test internal voltage VBLP_TEST is higher than the test reference voltage VCORE_HALF. In the present embodiment, the first logic level may be set as a logic "low" level and the second logic level may be set as a logic "high" level. An operation and a configuration of the counting operation control signal generation circuit 12 is described more fully below with reference to FIG. 3.

The internal voltage drive adjustment circuit 13 may drive levels of an internal voltage VBLP and the test internal voltage VBLP_TEST on the basis of the internal voltage VBLP, the upper limit reference voltage VBLP_H, the lower limit reference voltage VBLP_L, the test reference voltage VCORE_HALF, the pull-up counting operation control signal CNT_CTRP, the pull-down counting operation control signal CNT_CTRN, a counting oscillation signal CNT_OSC, a test mode signal TRIM_EN, an adjustment activation signal CAL_EN, and the test internal voltage VBLP_TEST. The test mode signal TRIM_EN may be enabled to activate the test mode for adjusting a level of the test internal voltage VBLP_TEST. The test mode signal TRIM_EN may be disabled to inactivate the test mode. After the test mode is activated, a level of the adjustment activation signal CAL_EN may change from the first logic level to the second logic level and the adjustment activation signal CAL_EN may maintain the second logic level. In the present embodiment, a logic level of the test mode signal TRIM_EN which is enabled may be set as a logic "high" level. The counting oscillation signal CNT_OSC may be generated by an oscillator (not shown) of a semiconductor device including the internal voltage generation circuit 1 or may be provided by an external system separated from the semiconductor device. The counting oscillation signal CNT_OSC may include pulses which are periodically created. A cycle of the counting oscillation signal CNT_OSC may be set differently for different embodiments.

The internal voltage drive adjustment circuit 13 may compare the internal voltage VBLP with the upper limit reference voltage VBLP_H and the lower limit reference voltage VBLP_L to drive the internal voltage VBLP if the test mode signal TRIM_EN is disabled to inactivate the test mode. The internal voltage drive adjustment circuit 13 may compare the test internal voltage VBLP_TEST with the test reference voltage VCORE_HALF to drive the test internal voltage VBLP_TEST if the test mode signal TRIM_EN is enabled to activate the test mode. The internal voltage drive adjustment circuit 13 may adjust a level of the test internal voltage VBLP_TEST in response to the pull-up counting operation control signal CNT_CTRP, the pull-down counting operation control signal CNT_CTRN, the counting oscillation signal CNT_OSC, and the adjustment activation signal CAL_EN while the test mode signal TRIM_EN is enabled to activate the test mode. An operation and a configuration of the internal voltage drive adjustment circuit 13 is described more fully below with reference to FIGS. 4 to 12.

Figure 2:
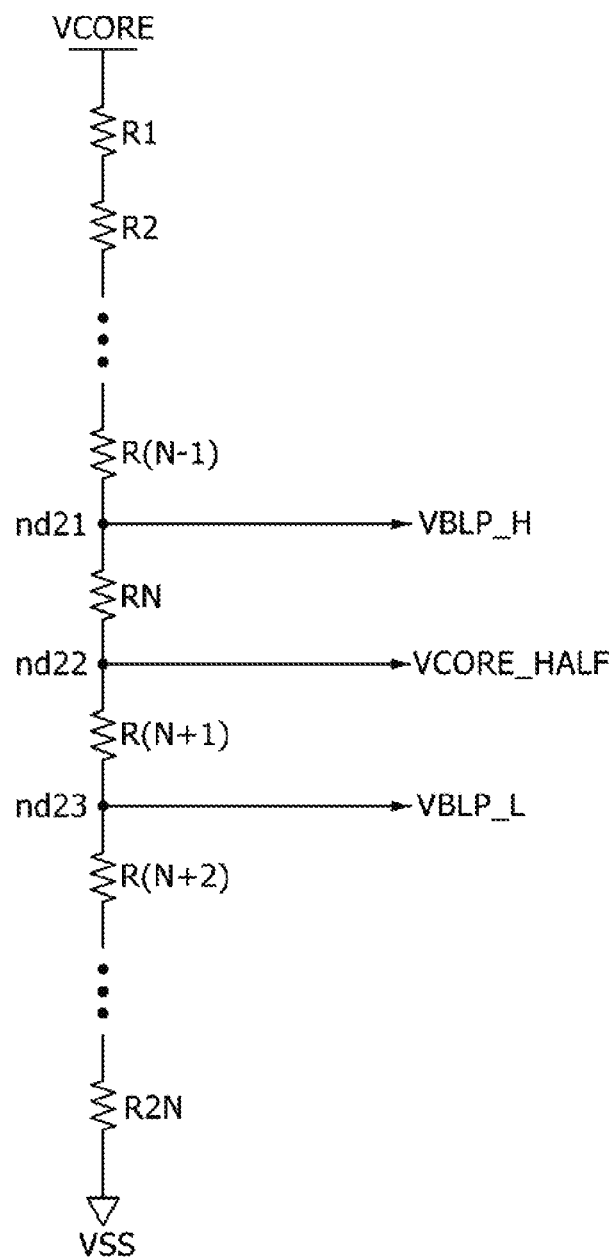
FIG. 2 shows a circuit diagram illustrating a reference voltage generation circuit included in the internal voltage generation circuit of FIG. 1.

Referring to FIG. 2, the reference voltage generation circuit 11 may include resistive elements R1~R2N, which are coupled in series between a core voltage VCORE terminal and a ground voltage VSS terminal. As used herein, the tilde "~" indicates a range of components. For example, "R1~R2N" indicates the resistive elements R1, R2, . . . , R(N−1), RN, R(N+1), R(N+2), . . . , and R2N shown in FIG. 2. The reference voltage generation circuit 11 may divide the core voltage VCORE to generate the upper limit reference voltage VBLP_H, the test reference voltage VCORE_HALF, and the lower limit reference voltage VBLP_L. The reference voltage generation circuit 11 may output the upper limit reference voltage VBLP_H through a node nd21, may output the test reference voltage VCORE_HALF through a node nd22, and may output the lower limit reference voltage VBLP_L through a node nd23. In the present embodiment, the test reference voltage VCORE_HALF may be set to be half a level of the core voltage VCORE, the upper limit reference voltage VBLP_H may be set to be higher than the test reference voltage VCORE_HALF, and the lower limit reference voltage VBLP_L may be set to be lower than the test reference voltage VCORE_HALF. The number '2N' (where 'N' denotes a natural number) of the resistive elements R1~R2N may be different for different embodiments. A level of the upper limit reference voltage VBLP_H may be set to be different according to the embodiments. Similarly, a level of the lower limit reference voltage VBLP_L may be set to be different according to the embodiments.

Figure 3:
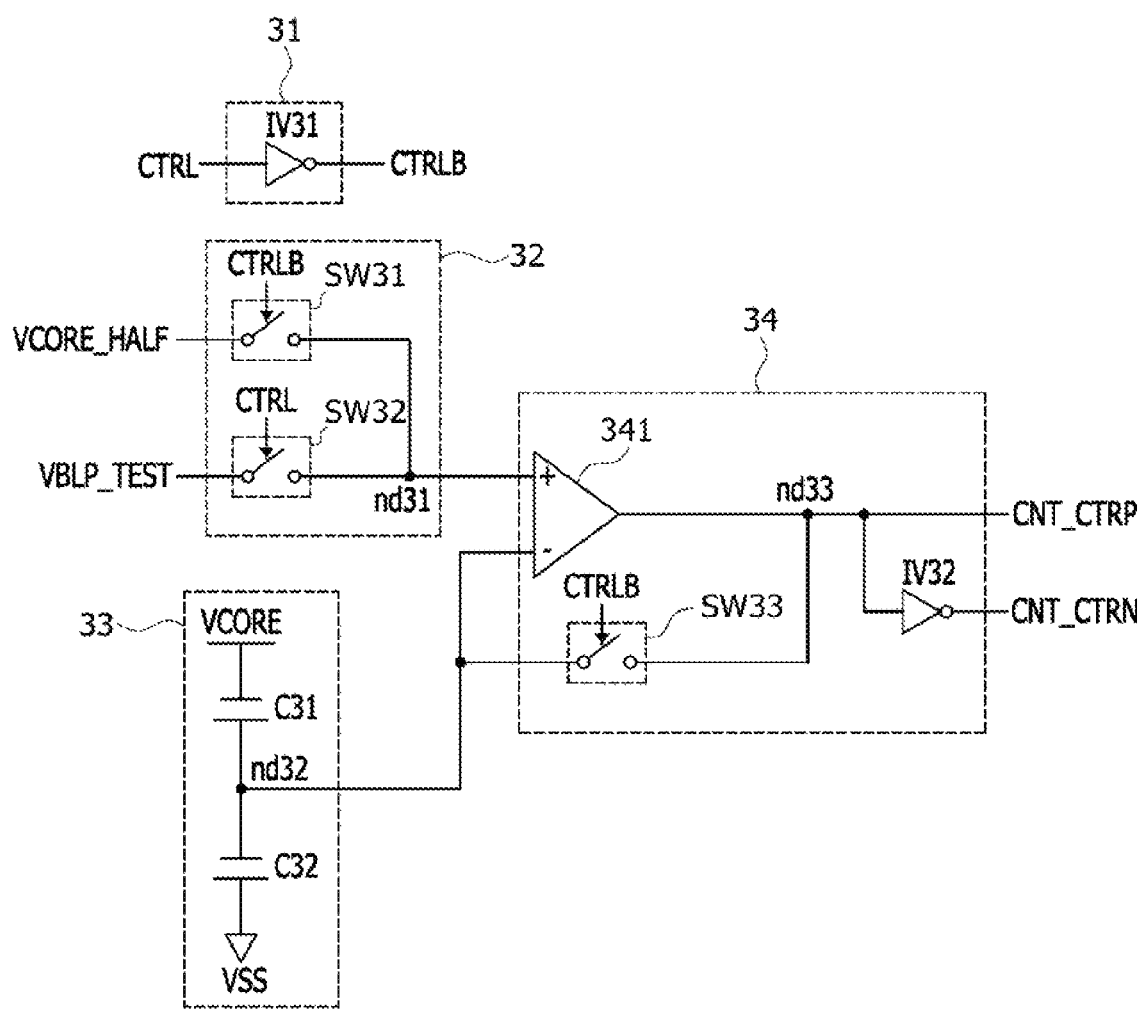
FIG. 3 shows a circuit diagram illustrating a counting operation control signal generation circuit included in the internal voltage generation circuit of FIG. 1.

Referring to FIG. 3, the counting operation control signal generation circuit 12 may include a control signal inversion circuit 31, a selection input circuit 32, a voltage stabilization circuit 33, and a counting operation control signal output circuit 34.

The control signal inversion circuit 31 may include an inverter IV31. The inverter IV31 may inversely buffer the control signal CTRL to generate an inverted control signal CTRLB. A level of the control signal CTRL may change from a logic "low" level to a logic "high" level at a point in time when a time period necessary for drive of the test internal voltage VBLP_TEST elapses from a point in time when the internal voltage generation circuit 1 enters the test mode for adjusting a level of the test internal voltage VBLP_TEST. The time period necessary for adjusting a level of the test internal voltage VBLP_TEST after entering the test mode may be set to be differently according to embodiment.

The selection input circuit 32 may include a first input switch SW31 and a second input switch SW32. The first input switch SW31 may be turned on in response to the inverted control signal CTRLB. The first input switch SW31 may be turned on to transmit the test reference voltage VCORE_HALF to a node nd31 if the inverted control signal CTRLB having a logic "high" level is inputted to the first input switch SW31. The second input switch SW32 may be turned on in response to the control signal CTRL. The second input switch SW32 may be turned on to transmit the test internal voltage VBLP_TEST to the node nd31 if the control signal CTRL having a logic "high" level is inputted to the second input switch SW32.

The voltage stabilization circuit 33 may include capacitors C31 and C32. The capacitor C31 may be coupled between the core voltage VCORE terminal and a node nd32. The capacitor C32 may be coupled between the node nd32 and the ground voltage VSS terminal. The capacitors C31 and C32 may stabilize a voltage level of the node nd32. The capacitors C31 and C32 may prevent an input offset value of a voltage set comparison circuit 341 in the counting operation control signal output circuit 34 from abruptly varying according to variation of temperature. The capacitors C31 and C32 may respectively couple the node nd32 with the core voltage VCORE terminal and the ground voltage VSS terminal to stably maintain a voltage of the node nd32.

The counting operation control signal output circuit 34 may include the voltage set comparison circuit 341, a feedback switch SW33, and an inverter IV32. The feedback switch SW33 may be turned on in response to the inverted control signal CTRLB. The feedback switch SW33 may be turned on to feedback the pull-up counting operation control signal CNT_CTRP to the node nd32 if the inverted control signal CTRLB having a logic "high" level is inputted to the feedback switch SW33. The inverter IV32 may inversely buffer the pull-up counting operation control signal CNT_CTRP to output the inversely buffered signal of the pull-up counting operation control signal CNT_CTRP as the pull-down counting operation control signal CNT_CTRN. The voltage set comparison circuit 341 may act as a voltage follower to output a voltage of the node nd31 as the pull-up counting operation control signal CNT_CTRP through a node nd33 while the feedback switch SW33 is turned on. The voltage set comparison circuit 341 may set the pull-up counting operation control signal CNT_CTRP as the test reference voltage VCORE_HALF while the feedback switch SW33 is turned on. The voltage set comparison circuit 341 may compare a voltage of the node nd31 with a voltage of the node nd32 to generate the pull-up counting operation control signal CNT_CTRP and the pull-down counting operation control signal CNT_CTRN while the feedback switch SW33 is turned off in response to the inverted control signal CTRLB having a logic "low" level. The voltage set comparison circuit 341 may generate the pull-up counting operation control signal CNT_CTRP having a logic "high" level and the pull-down counting operation control signal CNT_CTRN having a logic "low" level if the test internal voltage VBLP_TEST is higher than a voltage of the node nd32 set as the test reference voltage VCORE_HALF while the feedback switch SW33 is turned off. The voltage set comparison circuit 341 may generate the pull-up counting operation control signal CNT_CTRP having a logic "low" level and the pull-down counting operation control signal CNT_CTRN having a logic "high" level if the test internal voltage VBLP_TEST is lower than a voltage of the node nd32 while the feedback switch SW33 is turned off. The voltage set comparison circuit 341 may be realized using an operational amplifier (also referred to as 'OP amp').

The counting operation control signal generation circuit 12 may drive the pull-up counting operation control signal CNT_CTRP to have the same level as the test reference voltage VCORE_HALF while the control signal CTRL has a logic "low" level. The counting operation control signal generation circuit 12 may generate the pull-up counting operation control signal CNT_CTRP whose logic level is determined according to a level of the test internal voltage VBLP_TEST while the control signal CTRL has a logic "high" level. The counting operation control signal generation circuit 12 may generate the pull-up counting operation control signal CNT_CTRP having a logic "low" level and the pull-down counting operation control signal CNT_CTRN having a logic "high" level if the test internal voltage VBLP_TEST is lower than the test reference voltage VCORE_HALF. The counting operation control signal generation circuit 12 may generate the pull-up counting operation control signal CNT_CTRP having a logic "high" level and the pull-down counting operation control signal CNT_CTRN having a logic "low" level if the test internal voltage VBLP_TEST is higher than the test reference voltage VCORE_HALF.

Figure 4:
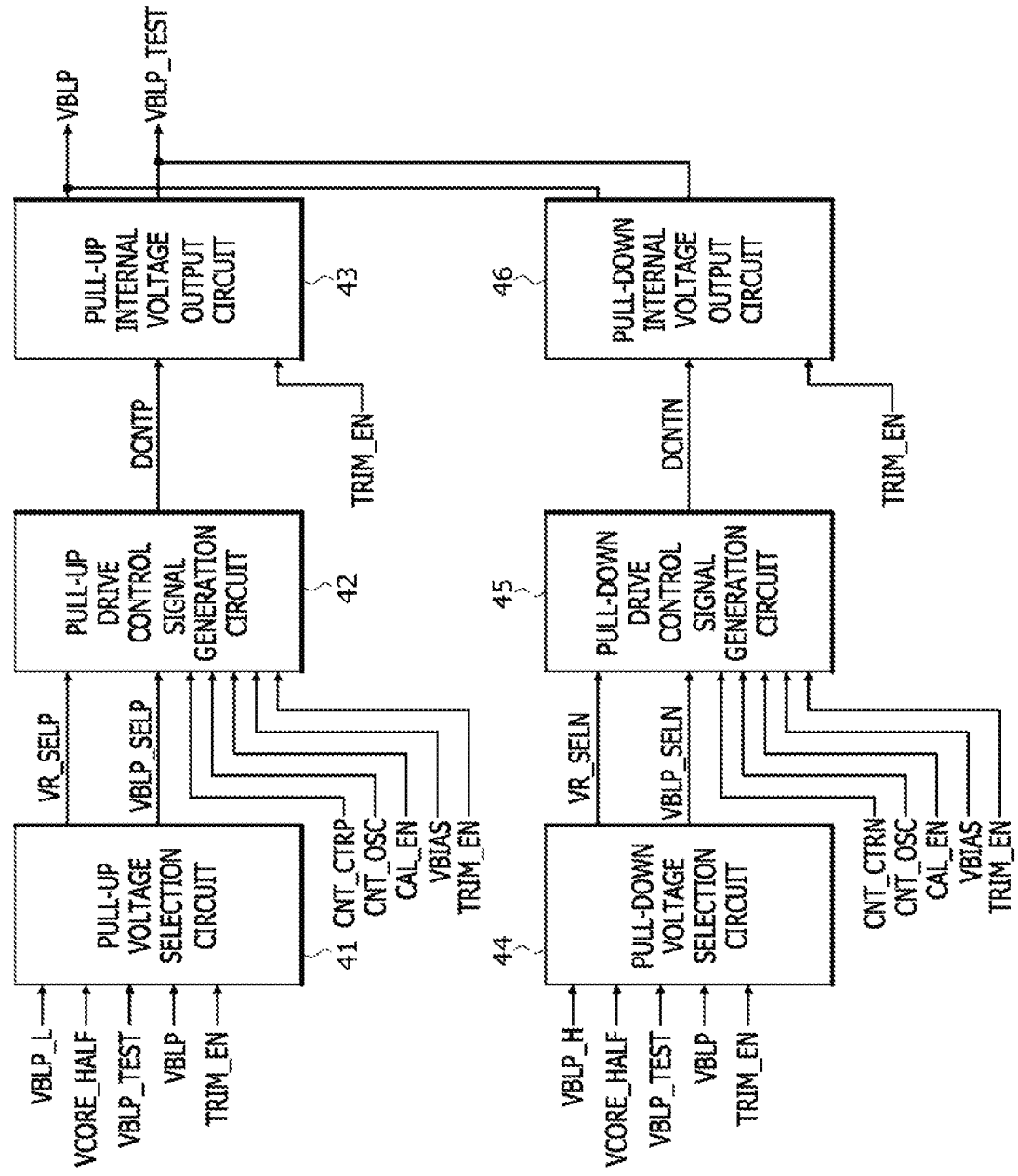
FIG. 4 shows a block diagram illustrating an internal voltage drive adjustment circuit included in the internal voltage generation circuit of FIG. 1.

Referring to FIG. 4, the internal voltage drive adjustment circuit 13 may include a pull-up voltage selection circuit 41, a pull-up drive control signal generation circuit 42, a pull-up internal voltage output circuit 43, a pull-down voltage selection circuit 44, a pull-down drive control signal generation circuit 45, and a pull-down internal voltage output circuit 46. For some embodiments, at least one of the pull-up drive control signal generation circuit 42 and the pull-down drive control signal generation circuit 45 may be implemented as a drive control signal generation circuit. Similarly, at least one of the pull-up voltage selection circuit 41 and the pull-down voltage selection circuit 44 may be implemented as a voltage selection circuit. Likewise, at least one of the pull-up internal voltage output circuit 43 and the pull-down internal voltage output circuit 46 may be implemented as an internal voltage output circuit. Accordingly, at least one of a pull-up signal and a pull-down signal, for a signal among various signals, may be implemented as a signal without the "pull-up" or "pull-down" designation. For example, at least one of the pull-up counting operation control signal and the pull-down counting operation control signal may be implemented, for naming purposes, as a counting operation control signal.

The pull-up voltage selection circuit 41 may generate a pull-up selection reference voltage VR_SELP from the lower limit reference voltage VBLP_L and the test reference voltage VCORE_HALF in response to the test mode signal TRIM_EN. The test mode signal TRIM_EN may be enabled to have a logic "high" level in order to activate the test mode for adjusting a level of the test internal voltage VBLP_TEST. The pull-up voltage selection circuit 41 may select and output the lower limit reference voltage VBLP_L as the pull-up selection reference voltage VR_SELP if the test mode signal TRIM_EN disabled to have a logic "low" level is inputted to the pull-up voltage selection circuit 41. The pull-up voltage selection circuit 41 may select and output the test reference voltage VCORE_HALF as the pull-up selection reference voltage VR_SELP if the test mode signal TRIM_EN enabled to have a logic "high" level is inputted to the pull-up voltage selection circuit 41.

The pull-up voltage selection circuit 41 may generate a pull-up selection internal voltage VBLP_SELP from the internal voltage VBLP and the test internal voltage VBLP_TEST in response to the test mode signal TRIM_EN. The pull-up voltage selection circuit 41 may select and output the internal voltage VBLP as the pull-up selection internal voltage VBLP_SELP if the test mode signal TRIM_EN disabled to have a logic "low" level is inputted to the pull-up voltage selection circuit 41. The pull-up voltage selection circuit 41 may select and output the test internal voltage VBLP_TEST as the pull-up selection internal voltage VBLP_SELP if the test mode signal TRIM_EN enabled to have a logic "high" level is inputted to the pull-up voltage selection circuit 41. An operation and a configuration of the pull-up voltage selection circuit 41 is described more fully below with reference to FIG. 5.

The pull-up drive control signal generation circuit 42 may generate a pull-up drive control signal DCNTP from the pull-up selection reference voltage VR_SELP and the pull-up selection internal voltage VBLP_SELP in response to the pull-up counting operation control signal CNT_CTRP, the counting oscillation signal CNT_OSC, the adjustment activation signal CAL_EN, a bias voltage VBIAS, and the test mode signal TRIM_EN. The bias voltage VBIAS may be set to have a certain level. A level of the bias voltage VBIAS may be set differently according to embodiment. The pull-up drive control signal generation circuit 42 may terminate a counting operation thereof to uniformly maintain a logic level combination of a pull-up drive adjustment signal (DTRIMP<1:2> of FIG. 6) if the pull-up counting operation control signal CNT_CTRP has the first logic level. The pull-up drive control signal generation circuit 42 may perform a counting operation to change a logic level combination of the pull-up drive adjustment signal (DTRIMP<1:2> of FIG. 6) whenever a pulse of the counting oscillation signal CNT_OSC is created if the pull-up counting operation control signal CNT_CTRP has the second logic level while the test mode signal TRIM_EN is enabled to activate the test mode. In such a case, the logic level combination of the pull-up drive adjustment signal (DTRIMP<1:2> of FIG. 6) may be adjusted to reduce or increase a level of the test internal voltage VBLP_TEST according to embodiment. An operation and a configuration of the pull-up drive control signal generation circuit 42 is described more fully below with reference to FIGS. 6 and 7.

The pull-up internal voltage output circuit 43 may generate the internal voltage VBLP and the test internal voltage VBLP_TEST in response to the test mode signal TRIM_EN and the pull-up drive control signal DCNTP. The pull-up internal voltage output circuit 43 may drive the internal voltage VBLP in response to the pull-up drive control signal DCNTP if the test mode signal TRIM_EN is disabled to inactivate the test mode. The pull-up internal voltage output circuit 43 may drive the internal voltage VBLP and the test internal voltage VBLP_TEST in response to the pull-up drive control signal DCNTP if the test mode signal TRIM_EN is enabled to activate the test mode. An operation and a configuration of the pull-up internal voltage output circuit 43 is described more fully below with reference to FIG. 8.

The pull-down voltage selection circuit 44 may generate a pull-down selection reference voltage VR_SELN from the upper limit reference voltage VBLP_H and the test reference voltage VCORE_HALF in response to the test mode signal TRIM_EN. The pull-down voltage selection circuit 44 may select and output the upper limit reference voltage VBLP_H as the pull-down selection reference voltage VR_SELN if the test mode signal TRIM_EN disabled to have a logic "low" level is inputted to the pull-down voltage selection circuit 44. The pull-down voltage selection circuit 44 may select and output the test reference voltage VCORE_HALF as the pull-down selection reference voltage VR_SELN if the test mode signal TRIM_EN enabled to have a logic "high" level is inputted to the pull-down voltage selection circuit 44.

The pull-down voltage selection circuit 44 may generate a pull-down selection internal voltage VBLP_SELN from the internal voltage VBLP and the test internal voltage VBLP_TEST in response to the test mode signal TRIM_EN. The pull-down voltage selection circuit 44 may select and output the internal voltage VBLP as the pull-down selection internal voltage VBLP_SELN if the test mode signal TRIM_EN disabled to have a logic "low" level is inputted to the pull-down voltage selection circuit 44. The pull-down voltage selection circuit 44 may select and output the test internal voltage VBLP_TEST as the pull-down selection internal voltage VBLP_SELN if the test mode signal TRIM_EN enabled to have a logic "high" level is inputted to the pull-down voltage selection circuit 44. An operation and a configuration of the pull-down voltage selection circuit 44 is described more fully below with reference to FIG. 9.

The pull-down drive control signal generation circuit 45 may generate a pull-down drive control signal DCNTN from the pull-down selection reference voltage VR_SELN and the pull-down selection internal voltage VBLP_SELN in response to the pull-down counting operation control signal CNT_CTRN, the counting oscillation signal CNT_OSC, the adjustment activation signal CAL_EN, the bias voltage VBIAS, and the test mode signal TRIM_EN. The pull-down drive control signal generation circuit 45 may terminate a counting operation thereof to uniformly maintain a logic level combination of a pull-down drive adjustment signal (DTRIMN<1:2> of FIG. 10) if the pull-down counting operation control signal CNT_CTRN has the first logic level. The pull-down drive control signal generation circuit 45 may perform a counting operation to change a logic level combination of the pull-down drive adjustment signal (DTRIMN<1:2> of FIG. 10) whenever a pulse of the counting oscillation signal CNT_OSC is created if the pull-down counting operation control signal CNT_CTRN has the second logic level while the test mode signal TRIM_EN is enabled to activate the test mode. In such a case, the logic level combination of the pull-down drive adjustment signal (DTRIMN<1:2> of FIG. 10) may be adjusted to reduce or increase a level of the test internal voltage VBLP_TEST according to embodiment. An operation and a configuration of the pull-down drive control signal generation circuit 45 is described more fully below with reference to FIGS. 10 and 11.

The pull-down internal voltage output circuit 46 may generate the internal voltage VBLP and the test internal voltage VBLP_TEST in response to the test mode signal TRIM_EN and the pull-down drive control signal DCNTN.

The pull-down internal voltage output circuit 46 may drive the internal voltage VBLP in response to the pull-down drive control signal DCNTN if the test mode signal TRIM_EN is disabled to inactivate the test mode. The pull-down internal voltage output circuit 46 may drive the internal voltage VBLP and the test internal voltage VBLP_TEST in response to the pull-down drive control signal DCNTN if the test mode signal TRIM_EN is enabled to activate the test mode. An operation and a configuration of the pull-down internal voltage output circuit 46 is described more fully below with reference to FIG. 12.

Figure 5:
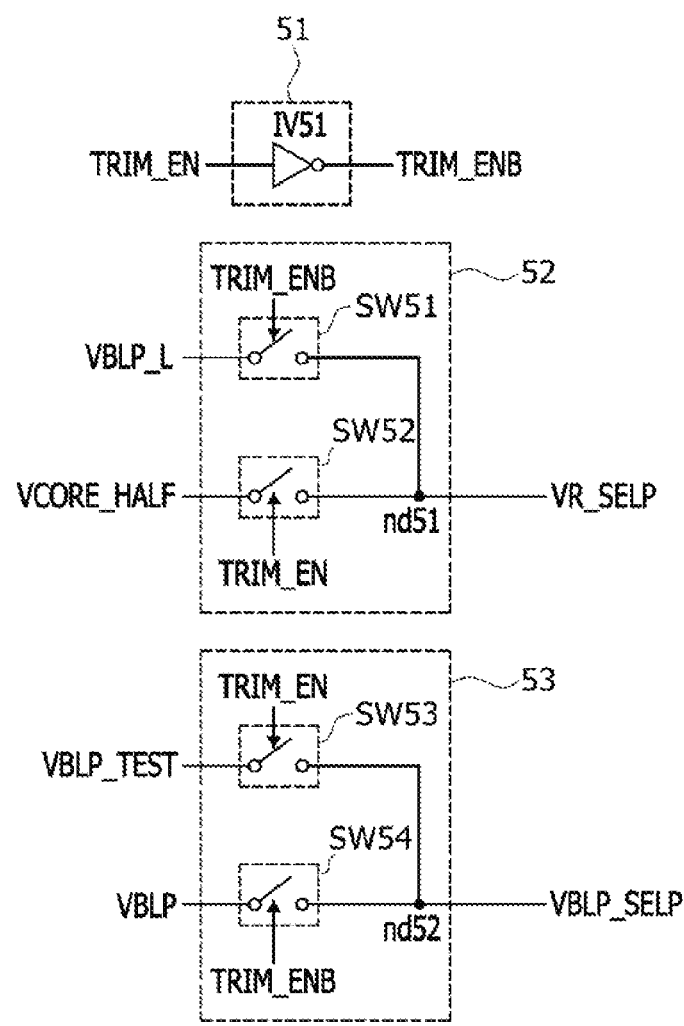
FIG. 5 shows a circuit diagram illustrating a pull-up voltage selection circuit included in the internal voltage drive adjustment circuit of FIG. 4.

Referring to FIG. 5, the pull-up voltage selection circuit 41 may include a pull-up test mode signal inversion circuit 51, a pull-up selection reference voltage generation circuit 52, and a pull-up selection internal voltage generation circuit 53.

The pull-up test mode signal inversion circuit 51 may include an inverter IV51. The inverter IV51 may inversely buffer the test mode signal TRIM_EN to generate an inverted test mode signal TRIM_ENB. The test mode signal TRIM_EN may be enabled to have a logic "high" level in order to activate the test mode for adjusting a level of the test internal voltage VBLP_TEST. The test mode signal TRIM_EN may be disabled to have a logic "low" level in order to terminate the test mode.

The pull-up selection reference voltage generation circuit 52 may include a first reference voltage switch SW51 and a second reference voltage switch SW52. The first reference voltage switch SW51 may be turned on in response to the inverted test mode signal TRIM_ENB. The first reference voltage switch SW51 may be turned on to output the lower limit reference voltage VBLP_L as the pull-up selection reference voltage VR_SELP through a node nd51 if the inverted test mode signal TRIM_ENB having a logic "high" level is inputted to the first reference voltage switch SW51. The second reference voltage switch SW52 may be turned on in response to the test mode signal TRIM_EN. The second reference voltage switch SW52 may be turned on to output the test reference voltage VCORE_HALF as the pull-up selection reference voltage VR_SELP through the node nd51 if the test mode signal TRIM_EN having a logic "high" level is inputted to the second reference voltage switch SW52.

The pull-up selection internal voltage generation circuit 53 may include a first internal voltage switch SW53 and a second internal voltage switch SW54. The first internal voltage switch SW53 may be turned on in response to the test mode signal TRIM_EN. The first internal voltage switch SW53 may be turned on to output the test internal voltage VBLP_TEST as the pull-up selection internal voltage VBLP_SELP through a node nd52 if the test mode signal TRIM_EN having a logic "high" level is inputted to the first internal voltage switch SW53. The second internal voltage switch SW54 may be turned on in response to the inverted test mode signal TRIM_ENB. The second internal voltage switch SW54 may be turned on to output the internal voltage VBLP as the pull-up selection internal voltage VBLP_SELP through the node nd52 if the inverted test mode signal TRIM_ENB having a logic "high" level is inputted to the second internal voltage switch SW54.

The pull-up voltage selection circuit 41 may select and output the lower limit reference voltage VBLP_L as the pull-up selection reference voltage VR_SELP and may select and output the internal voltage VBLP as the pull-up selection internal voltage VBLP_SELP, if the test mode signal TRIM_EN disabled to have a logic "low" level is inputted to the pull-up voltage selection circuit 41. The pull-up voltage selection circuit 41 may select and output the test reference voltage VCORE_HALF as the pull-up selection reference voltage VR_SELP and may select and output the test internal voltage VBLP_TEST as the pull-up selection internal voltage VBLP_SELP, if the test mode signal TRIM_EN enabled to have a logic "high" level is inputted to the pull-up voltage selection circuit 41.

Figure 6:
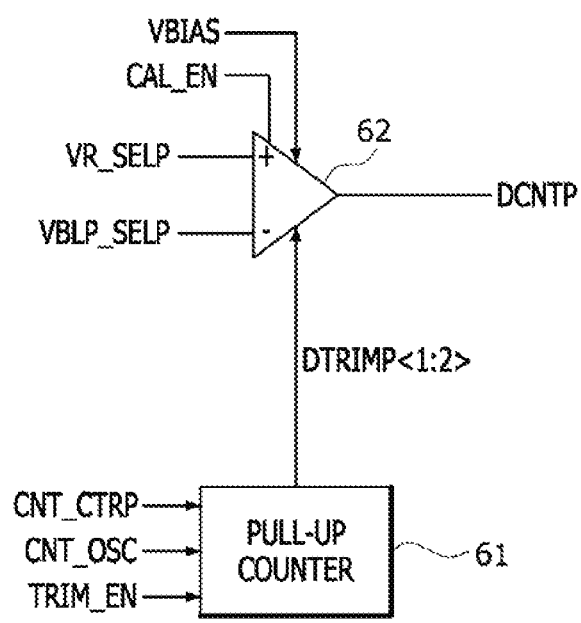
FIG. 6 illustrates a pull-up drive control signal generation circuit included in the internal voltage drive adjustment circuit of FIG. 4.

Referring to FIG. 6, the pull-up drive control signal generation circuit 42 may include a pull-up counter 61 and a pull-up comparison drive adjustment circuit 62.

The pull-up counter 61 may generate the pull-up drive adjustment signal DTRIMP<1:2> whose logic level combination is determined by performing a counting operation in response to the test mode signal TRIM_EN, the pull-up counting operation control signal CNT_CTRP, and the counting oscillation signal CNT_OSC. The pull-up counter 61 may perform a counting operation to adjust a logic level combination of the pull-up drive adjustment signal DTRIMP<1:2> if the test mode signal TRIM_EN is enabled to have a logic "high" level in order to activate the test mode and the pull-up counting operation control signal CNT_CTRP has a logic "high" level. The pull-up counter 61 may terminate the counting operation if the test mode is not activated or the pull-up counting operation control signal CNT_CTRP has a logic "low" level.

The pull-up comparison drive adjustment circuit 62 may generate the pull-up drive control signal DCNTP from the pull-up selection reference voltage VR_SELP and the pull-up selection internal voltage VBLP_SELP in response to the bias voltage VBIAS, the adjustment activation signal CAL_EN, and the pull-up drive adjustment signal DTRIMP<1:2>. The pull-up comparison drive adjustment circuit 62 may compare the pull-up selection reference voltage VR_SELP with the pull-up selection internal voltage VBLP_SELP to generate the pull-up drive control signal DCNTP while the adjustment activation signal CAL_EN is set to have a logic "high" level in the test mode. The pull-up comparison drive adjustment circuit 62 may adjust a level of the pull-up drive control signal DCNTP to lower or increase a level of the test internal voltage VBLP_TEST according to a logic level combination of the pull-up drive adjustment signal DTRIMP<1:2>. An operation of the pull-up comparison drive adjustment circuit 62 is described more fully below with reference to FIGS. 13 and 14.

Figure 7:
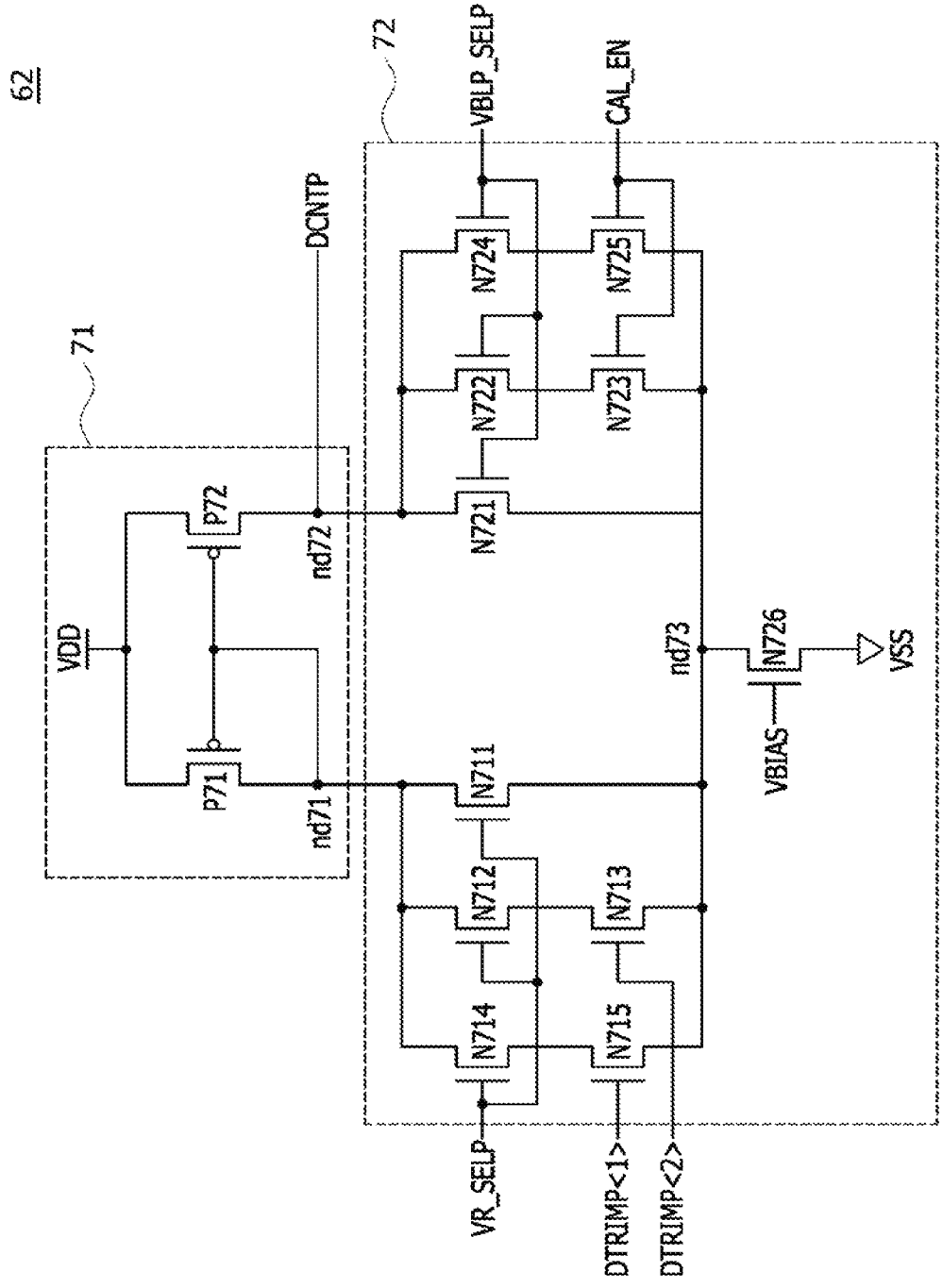
FIG. 7 shows a circuit diagram illustrating a pull-up comparison drive adjustment circuit included in the pull-up drive control signal generation circuit of FIG. 6.

Referring to FIG. 7, the pull-up comparison drive adjustment circuit 62 may include a current supplier 71 and a selection current discharger 72.

The current supplier 71 may include PMOS transistors P71 and P72. The PMOS transistor P71 may be coupled between a power supply voltage VDD terminal and a node nd71 and may be turned on in response to a voltage of the node nd71. The PMOS transistor P72 may be coupled between the power supply voltage VDD terminal and a node nd72 and may be turned on in response to a voltage of the node nd71. The PMOS transistors P71 and P72 may constitute a current mirror circuit to supply the same current to both of the nodes nd71 and nd72. The pull-up drive control signal DCNTP may be outputted through the node nd72.

The selection current discharger 72 may include NMOS transistors N711~N715. The NMOS transistor N711 may be coupled between the node nd71 and a node nd73, and a turn-on level of the NMOS transistor N711 may be adjusted by the pull-up selection reference voltage VR_SELP. The NMOS transistors N712 and N713 may be coupled in series between the node nd71 and the node nd73. A turn-on level of the NMOS transistor N712 may be adjusted by the pull-up selection reference voltage VR_SELP. A turn-on level of the NMOS transistor N713 may be adjusted by a second bit DTRIMP<2> of the pull-up drive adjustment signal DTRIMP<1:2>. The NMOS transistors N714 and N715 may be coupled in series between the node nd71 and the node nd73. A turn-on level of the NMOS transistor N714 may be adjusted by the pull-up selection reference voltage VR_SELP. A turn-on level of the NMOS transistor N715 may be adjusted by a first bit DTRIMP<1> of the pull-up drive adjustment signal DTRIMP<1:2>. In the present embodiment, a drivability of the NMOS transistors N712 and N713 may be set to be greater than a drivability of the NMOS transistors N714 and N715. That is, a ratio of a channel width to a channel length of each of the NMOS transistors N712 and N713 may be set to be greater than a ratio of a channel width to a channel length of each of the NMOS transistors N714 and N715. The ratio of a channel width to a channel length of each of the NMOS transistors N711~N715 may be set differently for different embodiments.

The selection current discharger 72 may further include NMOS transistors N721~N726. The NMOS transistor N721 may be coupled between the node nd72 and the node nd73, and a turn-on level of the NMOS transistor N721 may be adjusted by the pull-up selection internal voltage VBLP_SELP. The NMOS transistors N722 and N723 may be coupled in series between the node nd72 and the node nd73. A turn-on level of the NMOS transistor N722 may be adjusted by the pull-up selection internal voltage VBLP_SELP. A turn-on level of the NMOS transistor N723 may be adjusted by the adjustment activation signal CAL_EN. The NMOS transistors N724 and N725 may be coupled in series between the node nd72 and the node nd73. A turn-on level of the NMOS transistor N724 may be adjusted by the pull-up selection internal voltage VBLP_SELP. A turn-on level of the NMOS transistor N725 may be adjusted by the adjustment activation signal CAL_EN. The NMOS transistor N726 may be coupled between the node nd73 and the ground voltage VSS terminal and may be turned on in response to the bias voltage VBIAS. In the present embodiment, a drivability of the NMOS transistors N722 and N723 may be set to be greater than a drivability of the NMOS transistors N724 and N725. That is, a ratio of a channel width to a channel length of each of the NMOS transistors N722 and N723 may be set to be greater than a ratio of a channel width to a channel length of each of the NMOS transistors N724 and N725. The ratio of a channel width to a channel length of each of the NMOS transistors N721~N725 may be set to be different according to the embodiments.

The pull-up comparison drive adjustment circuit 62 may compare the pull-up selection reference voltage VR_SELP with the pull-up selection internal voltage VBLP_SELP to generate the pull-up drive control signal DCNTP while the adjustment activation signal CAL_EN is set to have a logic "high" level in the test mode. The pull-up comparison drive adjustment circuit 62 may adjust a level of the pull-up drive control signal DCNTP to lower or increase a level of the test internal voltage VBLP_TEST according to a logic level combination of the pull-up drive adjustment signal DTRIMP<1:2>.

Figure 8:
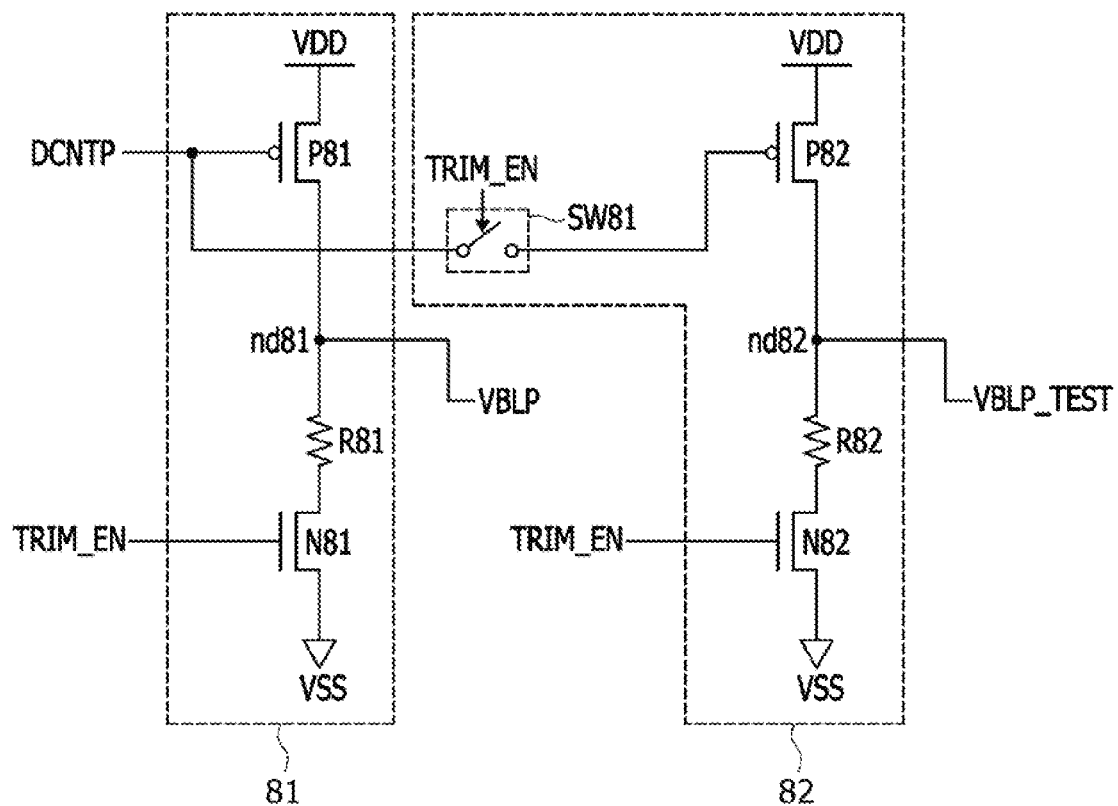
FIG. 8 shows a circuit diagram illustrating a pull-up internal voltage output circuit included in the internal voltage drive adjustment circuit of FIG. 4.

Referring to FIG. 8, the pull-up internal voltage output circuit 43 may include a pull-up drive circuit 81 and a test pull-up drive circuit 82.

The pull-up drive circuit 81 may include a PMOS transistor P81, a resistive element R81, and an NMOS transistor N81. The PMOS transistor P81 may be coupled between the power supply voltage VDD terminal and a node nd81 through which the internal voltage VBLP is outputted, and the PMOS transistor P81 may drive the node nd81 to pull up the internal voltage VBLP in response to the pull-up drive control signal DCNTP. The resistive element R81 and the NMOS transistor N81 may be coupled in series between the node nd81 and the ground voltage VSS terminal. The NMOS transistor N81 may be turned on in response to the test mode signal TRIM_EN.

The test pull-up drive circuit 82 may include a pull-up transfer switch SW81, a PMOS transistor P82, a resistive element R82, and an NMOS transistor N82. The pull-up transfer switch SW81 may be turned on to transmit the pull-up drive control signal DCNTP to the PMOS transistor P82 if the test mode signal TRIM_EN is enabled to have a logic "high" level in order to activate the test mode. The PMOS transistor P82 may be coupled between the power supply voltage VDD terminal and a node nd82 through which the test internal voltage VBLP_TEST is outputted, and the PMOS transistor P82 may drive the node nd82 to pull up the test internal voltage VBLP_TEST in response to the pull-up drive control signal DCNTP. The resistive element R82 and the NMOS transistor N82 may be coupled in series between the node nd82 and the ground voltage VSS terminal. The NMOS transistor N82 may be turned on in response to the test mode signal TRIM_EN. The test pull-up drive circuit 82 may adjust a pull-up level of the test internal voltage VBLP_TEST according to a level of the pull-up drive control signal DCNTP after the test mode is activated. If a level of the pull-up drive control signal DCNTP increases, a level of the test internal voltage VBLP_TEST may be lowered because a pull-up drivability of the PMOS transistor P82 is reduced. In contrast, if a level of the pull-up drive control signal DCNTP is lowered, a level of the test internal voltage VBLP_TEST may increase because a pull-up drivability of the PMOS transistor P82 increases.

Figure 9:
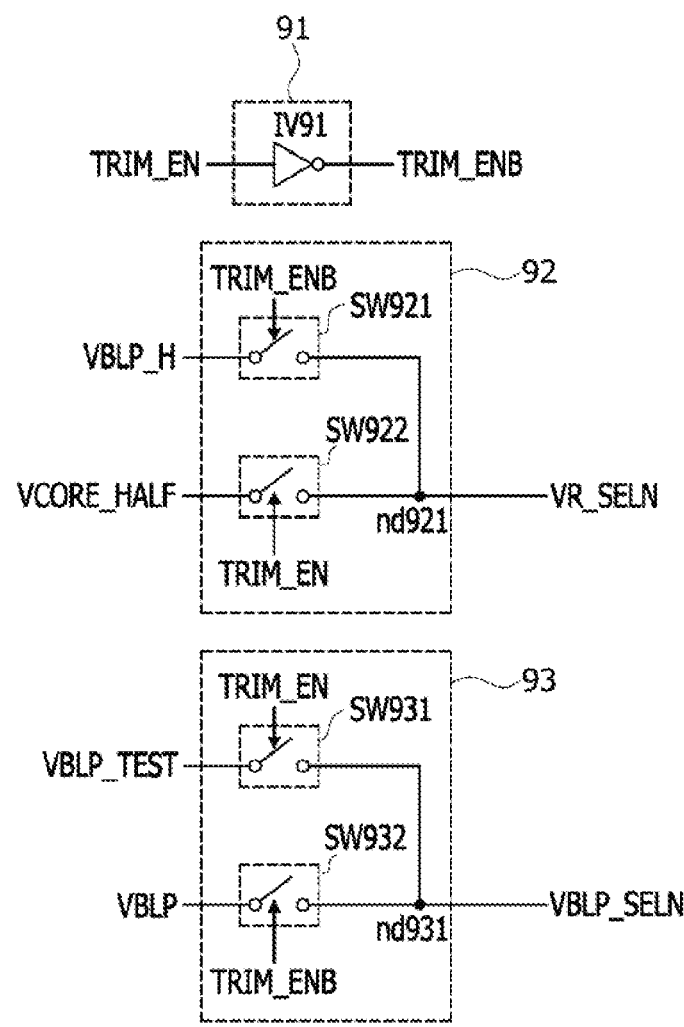
FIG. 9 shows a circuit diagram illustrating a pull-down voltage selection circuit included in the internal voltage drive adjustment circuit of FIG. 4.

Referring to FIG. 9, the pull-down voltage selection circuit 44 may include a pull-down test mode signal inversion circuit 91, a pull-down selection reference voltage generation circuit 92, and a pull-down selection internal voltage generation circuit 93.

The pull-down test mode signal inversion circuit 91 may include an inverter IV91. The inverter IV91 may inversely buffer the test mode signal TRIM_EN to generate an inverted test mode signal TRIM_ENB. The test mode signal TRIM_EN may be enabled to have a logic "high" level in order to activate the test mode for adjusting a level of the test internal voltage VBLP_TEST. The test mode signal TRIM_EN may be disabled to have a logic "low" level in order to terminate the test mode.

The pull-down selection reference voltage generation circuit 92 may include a first reference voltage switch SW921 and a second reference voltage switch SW922. The first reference voltage switch SW921 may be turned on in response to the inverted test mode signal TRIM_ENB. The first reference voltage switch SW921 may be turned on to output the upper limit reference voltage VBLP_H as the pull-down selection reference voltage VR_SELN through a node nd921 if the inverted test mode signal TRIM_ENB having a logic "high" level is inputted to the first reference voltage switch SW921. The second reference voltage switch SW922 may be turned on in response to the test mode signal TRIM_EN. The second reference voltage switch SW922 may be turned on to output the test reference voltage VCORE_HALF as the pull-down selection reference voltage VR_SELN through the node nd921 if the test mode signal TRIM_EN having a logic "high" level is inputted to the second reference voltage switch SW922.

The pull-down selection internal voltage generation circuit 93 may include a first internal voltage switch SW931 and a second internal voltage switch SW932. The first internal voltage switch SW931 may be turned on in response to the test mode signal TRIM_EN. The first internal voltage switch SW931 may be turned on to output the test internal voltage VBLP_TEST as the pull-down selection internal voltage VBLP_SELN through a node nd931 if the test mode signal TRIM_EN having a logic "high" level is inputted to the first internal voltage switch SW931. The second internal voltage switch SW932 may be turned on in response to the inverted test mode signal TRIM_ENB. The second internal voltage switch SW932 may be turned on to output the internal voltage VBLP as the pull-down selection internal voltage VBLP_SELN through the node nd931 if the inverted test mode signal TRIM_ENB having a logic "high" level is inputted to the second internal voltage switch SW932.

The pull-down voltage selection circuit 44 may select and output the upper limit reference voltage VBLP_H as the pull-down selection reference voltage VR_SELN and may select and output the internal voltage VBLP as the pull-down selection internal voltage VBLP_SELN, if the test mode signal TRIM_EN disabled to have a logic "low" level is inputted to the pull-down voltage selection circuit 44. The pull-down voltage selection circuit 44 may select and output the test reference voltage VCORE_HALF as the pull-down selection reference voltage VR_SELN and may select and output the test internal voltage VBLP_TEST as the pull-down selection internal voltage VBLP_SELN, if the test mode signal TRIM_EN enabled to have a logic "high" level is inputted to the pull-down voltage selection circuit 44.

Figure 10:
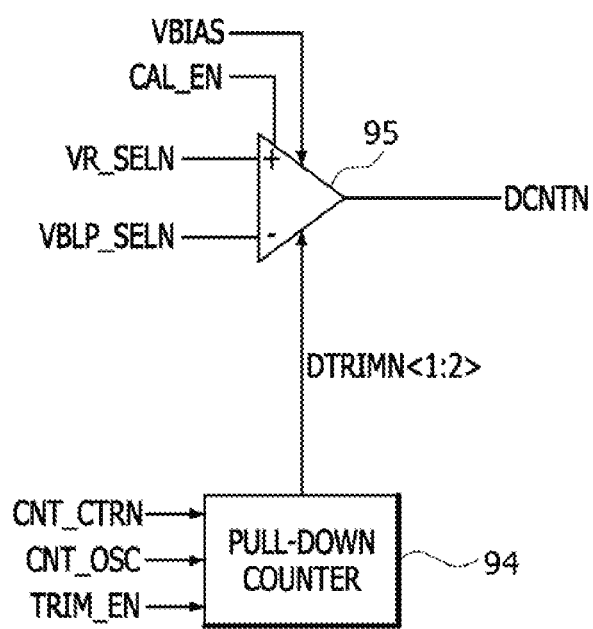
FIG. 10 illustrates a pull-down drive control signal generation circuit included in the internal voltage drive adjustment circuit of FIG. 4.

Referring to FIG. 10, the pull-down drive control signal generation circuit 45 may include a pull-down counter 94 and a pull-down comparison drive adjustment circuit 95.

The pull-down counter 94 may generate the pull-down drive adjustment signal DTRIMN<1:2> whose logic level combination is determined by performing a counting operation in response to the test mode signal TRIM_EN, the pull-down counting operation control signal CNT_CTRN, and the counting oscillation signal CNT_OSC. The pull-down counter 94 may perform a counting operation to adjust a logic level combination of the pull-down drive adjustment signal DTRIMN<1:2> if the test mode signal TRIM_EN is enabled to have a logic "high" level in order to activate the test mode and the pull-down counting operation control signal CNT_CTRN has a logic "high" level. The pull-down counter 94 may terminate the counting operation if the test mode is not activated or the pull-down counting operation control signal CNT_CTRN has a logic "low" level.

The pull-down comparison drive adjustment circuit 95 may generate the pull-down drive control signal DCNTN from the pull-down selection reference voltage VR_SELN and the pull-down selection internal voltage VBLP_SELN in response to the bias voltage VBIAS, the adjustment activation signal CAL_EN, and the pull-down drive adjustment signal DTRIMN<1:2>. The pull-down comparison drive adjustment circuit 95 may compare the pull-down selection reference voltage VR_SELN with the pull-down selection internal voltage VBLP_SELN to generate the pull-down drive control signal DCNTN while the adjustment activation signal CAL_EN is set to have a logic "high" level in the test mode. The pull-down comparison drive adjustment circuit 95 may adjust a level of the pull-down drive control signal DCNTN to lower or increase a level of the test internal voltage VBLP_TEST according to a logic level combination of the pull-down drive adjustment signal DTRIMN<1:2>. An operation of the pull-down comparison drive adjustment circuit 95 is described more fully below with reference to FIGS. 15 and 16.

Figure 11:
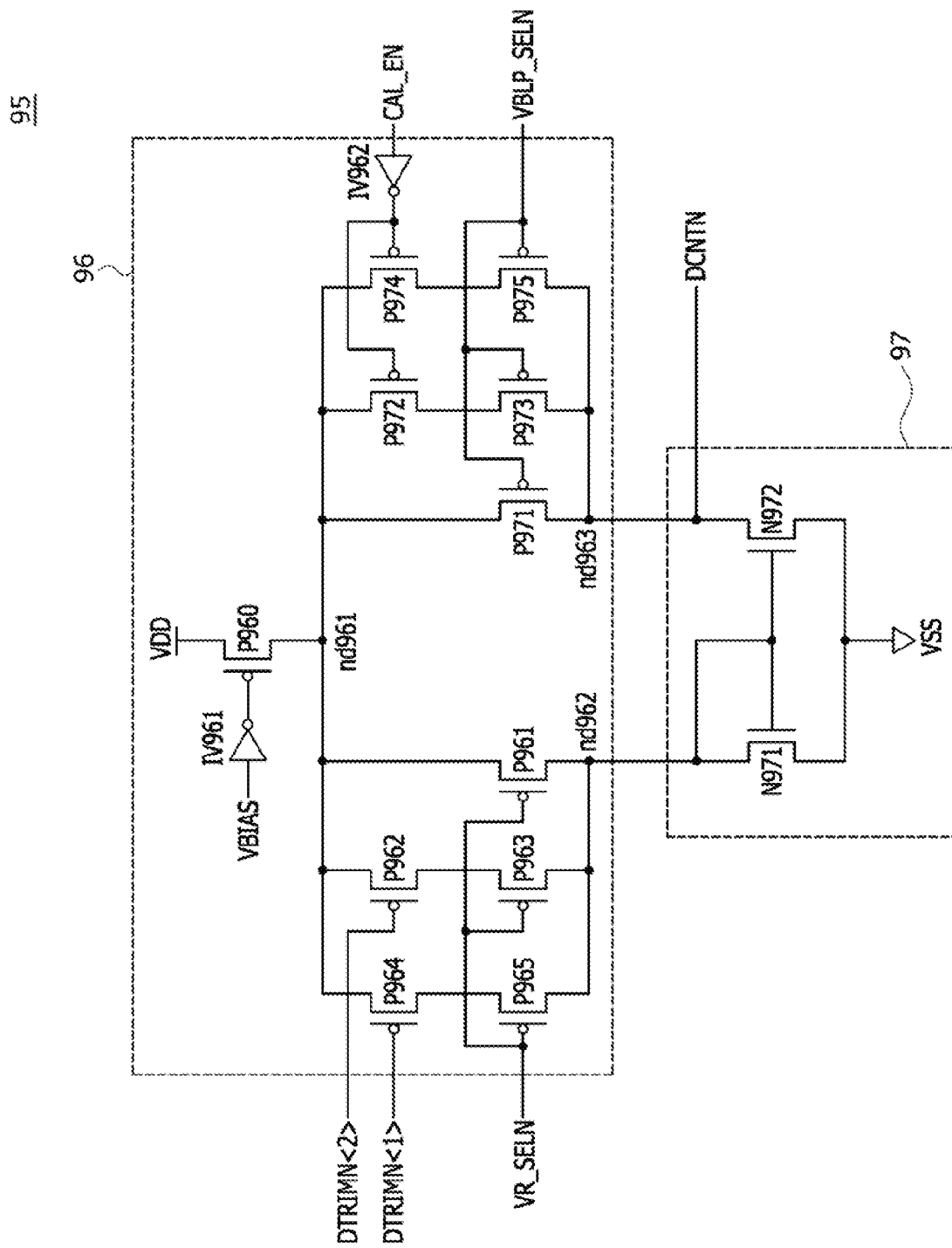
FIG. 11 shows a circuit diagram illustrating a pull-down comparison drive adjustment circuit included in the pull-down drive control signal generation circuit of FIG. 10.

Referring to FIG. 11, the pull-down comparison drive adjustment circuit 95 may include a selection current supplier 96 and a current discharger 97.

The selection current supplier 96 may include an inverter IV961 and PMOS transistors P960~P965. The inverter IV961 may inversely buffer the bias voltage VBIAS to output the inversely buffered voltage of the bias voltage VBIAS. The PMOS transistor P960 may be coupled between the power supply voltage VDD terminal and a node nd961 and may be turned on according to an output signal of the inverter IV961 to drive the node nd961 to the power supply voltage VDD. The PMOS transistor P961 may be coupled between the node nd961 and a node nd962, and a turn-on level of the PMOS transistor P961 may be adjusted by the pull-down selection reference voltage VR_SELN. The PMOS transistors P962 and P963 may be coupled in series between the node nd961 and the node nd962. A turn-on level of the PMOS transistor P962 may be adjusted by a second bit DTRIMN<2> of the pull-down drive adjustment signal DTRIMN<1:2>. A turn-on level of the PMOS transistor P963 may be adjusted by the pull-down selection reference voltage VR_SELN. The PMOS transistors P964 and P965 may be coupled in series between the node nd961 and the node nd962. A turn-on level of the PMOS transistor P964 may be adjusted by a first bit DTRIMN<1> of the pull-down drive adjustment signal DTRIMN<1:2>. A turn-on level of the PMOS transistor P965 may be adjusted by the pull-down selection reference voltage VR_SELN. In the present embodiment, a drivability of the PMOS transistors P964 and P965 may be set to be greater than a drivability of the PMOS transistors P962 and P963. That is, a ratio of a channel width to a channel length of each of the PMOS transistors P964 and P965 may be set to be greater than a ratio of a channel width to a channel length of each of the PMOS transistors P962 and P963. The ratio of a channel width to a channel length of each of the PMOS transistors P960~P965 may be set to be different according to the embodiments.

The selection current supplier 96 may further include an inverter IV962 and PMOS transistors P971~P975. The inverter IV962 may inversely buffer the adjustment activation signal CAL_EN to output the inversely buffered signal of the adjustment activation signal CAL_EN. The PMOS transistor P971 may be coupled between the node nd961 and a node nd963, and a turn-on level of the PMOS transistor P971 may be adjusted by the pull-down selection internal voltage VBLP_SELN. The PMOS transistors P972 and P973 may be coupled in series between the node nd961 and the node nd963. A turn-on level of the PMOS transistor P972 may be adjusted by an output signal of the inverter IV962. A turn-on level of the PMOS transistor P973 may be adjusted by the pull-down selection internal voltage VBLP_SELN. The PMOS transistors P974 and P975 may be coupled in series between the node nd961 and the node nd963. A turn-on level of the PMOS transistor P974 may be adjusted by an output signal of the inverter IV962. A turn-on level of the PMOS transistor P975 may be adjusted by the pull-down selection internal voltage VBLP_SELN. In the present embodiment, a drivability of the PMOS transistors P974 and P975 may be set to be greater than a drivability of the PMOS transistors P972 and P973. That is, a ratio of a channel width to a channel length of each of the PMOS transistors P974 and P975 may be set to be greater than a ratio of a channel width to a channel length of each of the PMOS transistors P972 and P973. The ratio of a channel width to a channel length of each of the PMOS transistors P971~P975 may be set differently for different embodiments.

The current discharger 97 may include NMOS transistors N971 and N972. The NMOS transistor N971 may be coupled between the node nd962 and the ground voltage VSS terminal and may be turned on in response to a voltage of the node nd962. The NMOS transistor N972 may be coupled between the node nd963 and the ground voltage VSS terminal and may be turned on in response to a voltage of the node nd962. The NMOS transistors N971 and N972 may constitute a current mirror circuit to drain the same current from both of the nodes nd962 and nd963 into the ground voltage VSS terminal.

Figure 12:
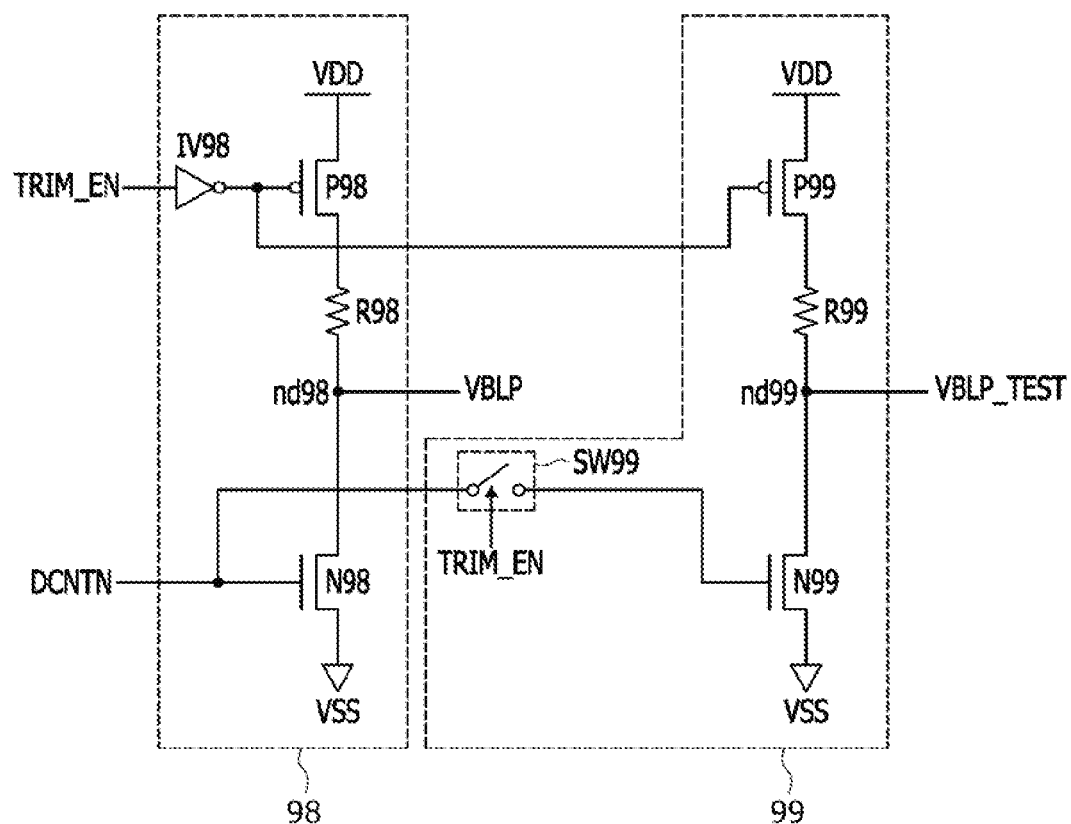
FIG. 12 shows a circuit diagram illustrating a pull-down internal voltage output circuit included in the internal voltage drive adjustment circuit of FIG. 4.

Referring to FIG. 12, the pull-down internal voltage output circuit 46 may include a pull-down drive circuit 98 and a test pull-down drive circuit 99.

The pull-down drive circuit 98 may include an inverter IV98, a PMOS transistor P98, a resistive element R98, and an NMOS transistor N98. The inverter IV98 may receive and inversely buffer the test mode signal TRIM_EN to output the inversely buffered signal of the test mode signal TRIM_EN. The PMOS transistor P98 and the resistive element R98 may be coupled in series between the power supply voltage VDD terminal and a node nd98 through which the internal voltage VBLP is outputted. The PMOS transistor P98 may be turned on in response to an output signal of the inverter IV98 to pull up the internal voltage VBLP. The NMOS transistor N98 may be coupled between the node nd98 and the ground voltage VSS terminal. The NMOS transistor N98 may be turned on in response to the pull-down drive control signal DCNTN to pull down the internal voltage VBLP.

The test pull-down drive circuit 99 may include a pull-down transfer switch SW99, a PMOS transistor P99, a resistive element R99, and an NMOS transistor N99. The pull-down transfer switch SW99 may be turned on to transmit the pull-down drive control signal DCNTN to the NMOS transistor N99 if the test mode signal TRIM_EN is enabled to have a logic "high" level in order to activate the test mode. The PMOS transistor P99 and the resistive element R99 may be coupled in series between the power supply voltage VDD terminal and a node nd99 through which the test internal voltage VBLP_TEST is outputted. The PMOS transistor P99 may be turned on in response to an output signal of the inverter IV98 to pull up the test internal voltage VBLP_TEST. The NMOS transistor N99 may be coupled between the node nd99 and the ground voltage VSS terminal. The NMOS transistor N99 may be turned on in response to the pull-down drive control signal DCNTN to pull down the test internal voltage VBLP_TEST. The test pull-down drive circuit 99 may adjust a pull-down level of the test internal voltage VBLP_TEST according to a level of the pull-down drive control signal DCNTN after the test mode is activated. If a level of the pull-down drive control signal DCNTN increases, then a level of the test internal voltage VBLP_TEST may be lowered because a pull-down drivability of the NMOS transistor N99 increases. In contrast, if a level of the pull-down drive control signal DCNTN is lowered, then a level of the test internal voltage VBLP_TEST may increase because a pull-down drivability of the NMOS transistor P99 is reduced.

Referring to FIG. 13, various levels of the pull-up drive control signal DCNTP according to various logic level combinations of the pull-up drive adjustment signal DTRIMP<1:2> are illustrated. If the pull-up drive adjustment signal DTRIMP<1:2> has a logic level combination of 'LL,' then the pull-up drive control signal DCNTP may be set to have a level of 'PL1.' In the pull-up drive adjustment signal DTRIMP<1:2>, the logic level combination of 'LL' means that both of the first bit DTRIMP<1> and the second bit DTRIMP<2> of the pull-up drive adjustment signal DTRIMP<1:2> are set to have a logic "low" level. If the pull-up drive adjustment signal DTRIMP<1:2> has a logic level combination of 'HL,' then the pull-up drive control signal DCNTP may be set to have a level of 'PL2.' In the pull-up drive adjustment signal DTRIMP<1:2>, the logic level combination of 'HL' means that the first bit DTRIMP<1> of the pull-up drive adjustment signal DTRIMP<1:2> is set to have a logic "high" level and the second bit DTRIMP<2> of the pull-up drive adjustment signal DTRIMP<1:2> is set to have a logic "low" level. If the pull-up drive adjustment signal DTRIMP<1:2> has a logic level combination of 'LH,' then the pull-up drive control signal DCNTP may be set to have a level of 'PL3.' In the pull-up drive adjustment signal DTRIMP<1:2>, the logic level combination of 'LH' means that the first bit DTRIMP<1> of the pull-up drive adjustment signal DTRIMP<1:2> is set to have a logic "low" level and the second bit DTRIMP<2> of the pull-up drive adjustment signal DTRIMP<1:2> is set to have a logic "high" level. If the pull-up drive adjustment signal DTRIMP<1:2> has a logic level combination of 'HH,' then the pull-up drive control signal DCNTP may be set to have a level of 'PL4.' In the pull-up drive adjustment signal DTRIMP<1:2>, the logic level combination of 'HH' means that both of the first bit DTRIMP<1> and the second bit DTRIMP<2> of the pull-up drive adjustment signal DTRIMP<1:2> are set to have a logic "high" level. The level of the pull-up drive control signal DCNTP corresponding to each logic level combination of the pull-up drive adjustment signal DTRIMP<1:2> may be set differently for different embodiments. In the present embodiment, levels of the pull-up drive control signal DCNTP may be set to sequentially increase in order of 'PL1,' 'PL2,' 'PL3,' and 'PL4' (i.e., PL1<PL2<PL3<PL4). That is, the level 'PL1' may be set to be the lowest level, and the level 'PL4' may be set to be the highest level.

An operation of the internal voltage generation circuit 1 for adjusting a level of the test internal voltage VBLP_TEST in the test mode is described hereinafter with reference to FIG. 14. It may be assumed that a correlation between levels of the pull-up drive control signal DCNTP and logic level combinations of the pull-up drive adjustment signal DTRIMP<1:2> is set as illustrated in the table of FIG. 13.

Figure 14:
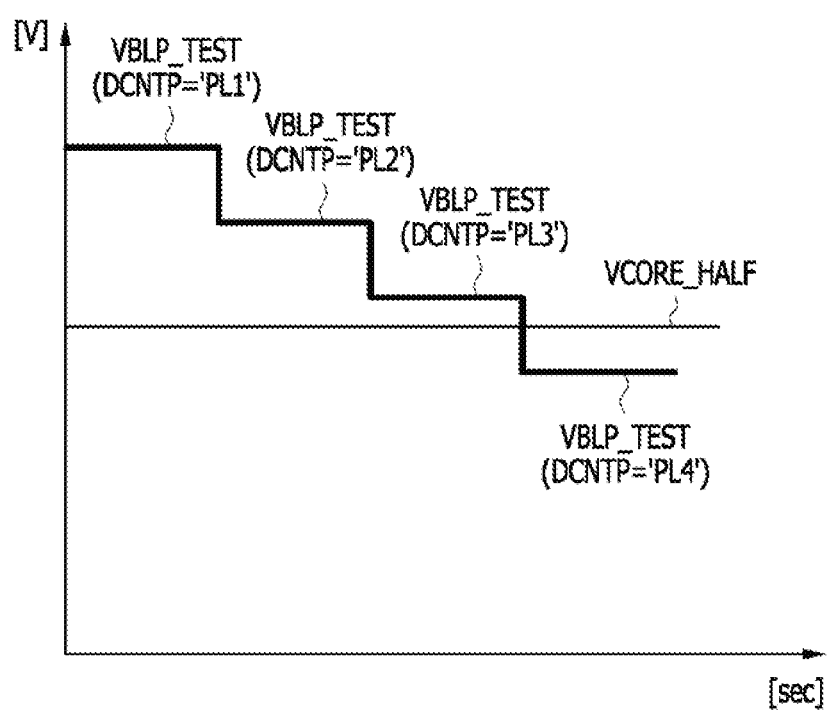
FIG. 14 shows a graph illustrating an operation where a test internal voltage is adjusted according to a level of a pull-up drive control signal shown in FIG. 13 in a test mode.

As illustrated in FIG. 14, because a level of the test internal voltage VBLP_TEST driven by the pull-up drive control signal DCNTP having a level of 'PL1' is higher than a level of the test reference voltage VCORE_HALF, the pull-up counting operation control signal CNT_CTRP may be generated to have a logic "high" level so that the pull-up counter (61 of FIG. 6) performs a counting operation. Because a logic level combination of the pull-up drive adjustment signal DTRIMP<1:2> changes from 'LL' to 'HL,' the pull-up drive control signal DCNTP generated by the pull-up comparison drive adjustment circuit (62 of FIG. 6) may have a level of 'PL2.' Because a level of the test internal voltage VBLP_TEST driven by the pull-up drive control signal DCNTP having a level of 'PL2' is higher than a level of the test reference voltage VCORE_HALF, the pull-up counting operation control signal CNT_CTRP may be generated to have a logic "high" level so that the pull-up counter (61 of FIG. 6) performs a counting operation. Because a logic level combination of the pull-up drive adjustment signal DTRIMP<1:2> changes from 'HL' to 'LH,' the pull-up drive control signal DCNTP generated by the pull-up comparison drive adjustment circuit (62 of FIG. 6) may have a level of 'PL3.' Because a level of the test internal voltage VBLP_TEST driven by the pull-up drive control signal DCNTP having a level of 'PL3' is higher than a level of the test reference voltage VCORE_HALF, the pull-up counting operation control signal CNT_CTRP may be generated to have a logic "high" level so that the pull-up counter (61 of FIG. 6) performs a counting operation. Because a logic level combination of the pull-up drive adjustment signal DTRIMP<1:2> changes from 'LH' to 'HH,' the pull-up drive control signal DCNTP generated by the pull-up comparison drive adjustment circuit (62 of FIG. 6) may have a level of 'PL4.' Because a level of the test internal voltage VBLP_TEST driven by the pull-up drive control signal DCNTP having a level of 'PL4' is lower than a level of the test reference voltage VCORE_HALF, the pull-up counting operation control signal CNT_CTRP may be generated to have a logic "low" level so that the pull-up counter (61 of FIG. 6) terminates a counting operation.

According to the embodiment described above, as the pull-up drive adjustment signal DTRIMP<1:2> is counted, a level of the pull-up drive control signal DCNTP may be elevated to lower a level of the test internal voltage VBLP_TEST. However, the present disclosure is not limited to this embodiment. In some other embodiments, the internal voltage generation circuit 1 may be realized such that a level of the pull-up drive control signal DCNTP is lowered to increase a level of the test internal voltage VBLP_TEST as the pull-up drive adjustment signal DTRIMP<1:2> is counted.

Referring to FIG. 15, various levels of the pull-down drive control signal DCNTN according to various logic level combinations of the pull-down drive adjustment signal DTRIMN<1:2> are illustrated. If the pull-down drive adjustment signal DTRIMN<1:2> has a logic level combination of 'HH,' then the pull-down drive control signal DCNTN may be set to have a level of 'NL4.' For the pull-down drive adjustment signal DTRIMN<1:2>, the logic level combination of 'HH' means that both of the first bit DTRIMN<1> and the second bit DTRIMN<2> of the pull-down drive adjustment signal DTRIMN<1:2> are set to have a logic "high" level. If the pull-down drive adjustment signal DTRIMN<1:2> has a logic level combination of 'LH,' the pull-down drive control signal DCNTN may be set to have a level of 'NL3.' For the pull-down drive adjustment signal DTRIMN<1:2>, the logic level combination of 'LH' means that the first bit DTRIMN<1> of the pull-down drive adjustment signal DTRIMN<1:2> is set to have a logic "low" level and the second bit DTRIMN<2> of the pull-down drive adjustment signal DTRIMN<1:2> is set to have a logic "high" level. If the pull-down drive adjustment signal DTRIMN<1:2> has a logic level combination of 'HL,' the pull-down drive control signal DCNTN may be set to have a level of 'NL2.' For the pull-down drive adjustment signal DTRIMN<1:2>, the logic level combination of 'HL' means that the first bit DTRIMN<1> of the pull-down drive adjustment signal DTRIMN<1:2> is set to have a logic "high" level and the second bit DTRIMN<2> of the pull-down drive adjustment signal DTRIMN<1:2> is set to have a logic "low" level. If the pull-down drive adjustment signal DTRIMN<1:2> has a logic level combination of 'LL,' the pull-down drive control signal DCNTN may be set to have a level of 'NL1.' For the pull-down drive adjustment signal DTRIMN<1:2>, the logic level combination of 'LL' means that both of the first bit DTRIMN<1> and the second bit DTRIMN<2> of the pull-down drive adjustment signal DTRIMN<1:2> are set to have a logic "low" level. The level of the pull-down drive control signal DCNTN corresponding to each logic level combination of the pull-down drive adjustment signal DTRIMN<1:2> may be set differently for different embodiments. In the present embodiment, levels of the pull-down drive control signal DCNTN may be set to be sequentially lowered in order of 'NL4,' 'NL3,' 'NL2,' and 'NL1' (i.e., PL4>PL3>PL2>PL1). That is, the level 'NL4' may be set to be the highest level, and the level 'NL1' may be set to be the lowest level.

An operation of the internal voltage generation circuit 1 for adjusting a level of the test internal voltage VBLP_TEST in the test mode is described hereinafter with reference to FIG. 16. It may be assumed that a correlation between levels of the pull-down drive control signal DCNTN and logic level combinations of the pull-down drive adjustment signal DTRIMN<1:2> is set as illustrated in the table of FIG. 15.

Figure 16:
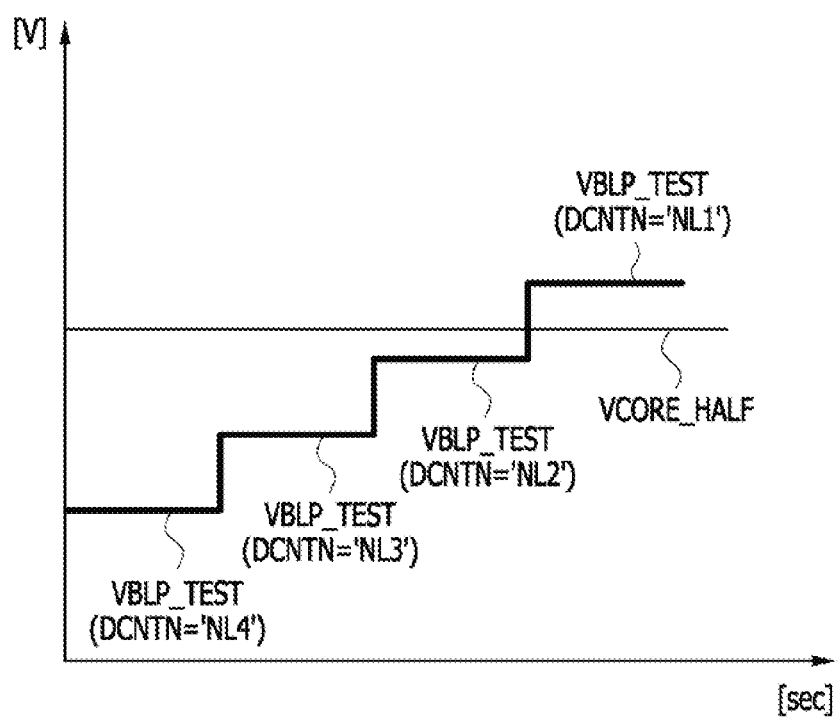
FIG. 16 shows a graph illustrating an operation where a test internal voltage is adjusted according to a level of a pull-down drive control signal shown in FIG. 15 in a test mode.

As illustrated in FIG. 16, because a level of the test internal voltage VBLP_TEST driven by the pull-down drive control signal DCNTN having a level of 'NL4' is lower than a level of the test reference voltage VCORE_HALF, the pull-down counting operation control signal CNT_CTRN may be generated to have a logic "high" level so that the pull-down counter (94 of FIG. 10) performs a counting operation. Because a logic level combination of the pull-down drive adjustment signal DTRIMN<1:2> changes from 'HH' to 'LH,' the pull-down drive control signal DCNTN generated by the pull-down comparison drive adjustment circuit (95 of FIG. 10) may have a level of 'NL3.' Because a level of the test internal voltage VBLP_TEST driven by the pull-down drive control signal DCNTN having a level of 'NL3' is lower than a level of the test reference voltage VCORE_HALF, the pull-down counting operation control signal CNT_CTRN may be generated to have a logic "high" level so that the pull-down counter (94 of FIG. 10) performs a counting operation. Because a logic level combination of the pull-down drive adjustment signal DTRIMN<1:2> changes from 'LH' to 'HL,' the pull-down drive control signal DCNTN generated by the pull-down comparison drive adjustment circuit (95 of FIG. 10) may have a level of 'NL2.' Because a level of the test internal voltage VBLP_TEST driven by the pull-down drive control signal DCNTN having a level of 'NL2' is lower than a level of the test reference voltage VCORE_HALF, the pull-down counting operation control signal CNT_CTRN may be generated to have a logic "high" level so that the pull-down counter (94 of FIG. 10) performs a counting operation. Because a logic level combination of the pull-down drive adjustment signal DTRIMN<1:2> changes from 'HL' to 'LL,' the pull-down drive control signal DCNTN generated by the pull-down comparison drive adjustment circuit (95 of FIG. 10) may have a level of 'NL1.' Because a level of the test internal voltage VBLP_TEST driven by the pull-down drive control signal DCNTN having a level of 'NL1' is higher than a level of the test reference voltage VCORE_HALF, the pull-down counting operation control signal CNT_CTRN may be generated to have a logic "low" level so that the pull-down counter (94 of FIG. 10) terminates a counting operation.

According to the embodiment described above, as the pull-down drive adjustment signal DTRIMN<1:2> is counted, a level of the pull-down drive control signal DCNTN may be lowered to increase a level of the test internal voltage VBLP_TEST. However, the present disclosure is not limited to this embodiment. In some other embodiments, the internal voltage generation circuit 1 may be realized such that a level of the pull-down drive control signal DCNTN is elevated to lower a level of the test internal voltage VBLP_TEST as the pull-down drive adjustment signal DTRIMN<1:2> is counted.

As described above, the internal voltage generation circuit 1 according to an embodiment may provide a test mode that can adjust a level of the test internal voltage VBLP_TEST according to the pull-up drive adjustment signal DTRIMP<1:2> or the pull-down drive adjustment signal DTRIMN<1:2> whose logic level combination varies according to a counting operation. The internal voltage generation circuit 1 may adjust a level of the test internal voltage VBLP_TEST within a certain range on the basis of the test reference voltage VCORE_HALF in the test mode even though an input offset value of an operational amplifier in the internal voltage generation circuit 1 varies. In the event that a bit line pre-charge voltage is generated by the internal voltage generation circuit 1, a level of the test internal voltage VBLP_TEST may be adjusted within a certain range on the basis of the test reference voltage VCORE_HALF in the test mode even though a level of the bit line pre-charge voltage changes according to variation of the input offset value of the operational amplifier in the internal voltage generation circuit 1. The internal voltage generation circuit 1 may stably maintain the bit line pre-charge voltage to prevent a data sensing margin from being reduced.

What is claimed is:

1. An internal voltage generation circuit comprising:
   a counting operation control signal generation circuit configured to compare a test internal voltage with a test reference voltage to generate a counting operation control signal in a test mode;
   a counter configured to perform a counting operation in response to the counting operation control signal to adjust a logic level combination of a drive adjustment signal whenever a pulse of a counting oscillation signal is created in the test mode; and
   a comparison drive adjustment circuit configured to compare a selection reference voltage with a selection internal voltage in response to the drive adjustment signal to generate a drive control signal.

2. The internal voltage generation circuit of claim 1, wherein the counting operation control signal generation circuit sets the counting operation control signal as the test reference voltage when the test mode is inactivated.

3. The internal voltage generation circuit of claim 1, wherein the counting operation control signal generation circuit comprises:
   a selection input circuit configured to transmit the test internal voltage or the test reference voltage to a first node according to a control signal; and
   a counting operation control signal output circuit configured to compare a voltage of the first node with a voltage of a second node having the test reference voltage to generate the counting operation control signal when the test mode is inactivated.

4. The internal voltage generation circuit of claim 3, wherein the selection input circuit comprises:
   a first input switch configured to be turned on to transmit the test reference voltage to the first node when the control signal has a first logic level; and
   a second input switch configured to be turned on to transmit the test internal voltage to the first node when the control signal has a second logic level.

5. The internal voltage generation circuit of claim 3, wherein the counting operation control signal output circuit comprises:
   a feedback switch configured to feedback the counting operation control signal to the second node according to the control signal; and
   a voltage set comparison circuit configured to compare a voltage of the first node with a voltage of the second node to generate the counting operation control signal.

6. The internal voltage generation circuit of claim 3, wherein the counting operation control signal generation circuit further comprises:
   a first capacitor coupled between a core voltage terminal and the second node; and
   a second capacitor coupled between the second node and a ground voltage terminal.

7. The internal voltage generation circuit of claim 1, further comprising a voltage selection circuit configured to select a reference voltage or the test reference voltage as the selection reference voltage according to a test mode signal and configured to select an internal voltage or the test internal voltage as the selection internal voltage according to the test mode signal.

8. The internal voltage generation circuit of claim 1, wherein the comparison drive adjustment circuit comprises:
   a current supplier configured to supply a current to a first node and a second node; and
   a selection current discharger configured to discharge a current flowing through the first node according to the selection reference voltage, configured to discharge a current flowing through the second node according to the selection internal voltage, and configured to adjust an amount of current discharged through the first node according to a logic level combination of the drive adjustment signal.

9. The internal voltage generation circuit of claim 1, further comprising an internal voltage output circuit configured to drive an internal voltage and the test internal voltage in response to a test mode signal and the drive control signal.

10. The internal voltage generation circuit of claim 9, wherein the internal voltage output circuit comprises:
    a drive circuit configured to drive the internal voltage in response to the drive control signal; and
    a test drive circuit configured to receive the drive control signal in the test mode and configured to drive the test internal voltage in response to the drive control signal.

11. An internal voltage generation circuit comprising:
    a counter configured to perform a counting operation in response to a counting operation control signal to adjust a logic level combination of a drive adjustment signal whenever a pulse of a counting oscillation signal is created in a test mode;
    a comparison drive adjustment circuit configured to compare a selection reference voltage with a selection internal voltage in response to the drive adjustment signal to generate a drive control signal; and
    a voltage selection circuit configured to select a reference voltage or a test reference voltage as the selection reference voltage according to a test mode signal and configured to select an internal voltage or a test internal voltage as the selection internal voltage according to the test mode signal.

12. The internal voltage generation circuit of claim 11, wherein the comparison drive adjustment circuit comprises:
    a current supplier configured to supply a current to a first node and a second node; and a selection current discharger configured to discharge a current flowing through the first node according to the selection reference voltage, configured to discharge a current flowing through the second node according to the selection internal voltage, and configured to adjust an amount of current discharged through the first node according to a logic level combination of the drive adjustment signal.

13. The internal voltage generation circuit of claim 11, further comprising an internal voltage output circuit configured to drive the internal voltage and the test internal voltage in response to the test mode signal and the drive control signal.

14. The internal voltage generation circuit of claim 13, wherein the internal voltage output circuit comprises:
   a drive circuit configured to drive the internal voltage in response to the drive control signal; and
   a test drive circuit configured to receive the drive control signal in the test mode and configured to drive the test internal voltage in response to the drive control signal.

* * * * *

UNITED STATES PATENT AND TRADEMARK OFFICE
CERTIFICATE OF CORRECTION

PATENT NO. : 10,719,094 B2
APPLICATION NO. : 16/529427
DATED : July 21, 2020
INVENTOR(S) : Se Hwan Kim Page 1 of 1

It is certified that error appears in the above-identified patent and that said Letters Patent is hereby corrected as shown below:

On the Title Page

Item (63) Related U.S. Application Data:
Replace "Continuation-in-part of application No. 16/206,411, filed on Nov. 30, 2018, now Pat. No. 10,416,693" with --Continuation of application No. 16/206,411, filed on Nov. 30, 2018, now Pat. No. 10,416,693--

Signed and Sealed this
Eighth Day of September, 2020

Andrei Iancu
*Director of the United States Patent and Trademark Office*